(12) United States Patent
Li

(10) Patent No.: US 11,877,502 B2
(45) Date of Patent: Jan. 16, 2024

(54) FLEXIBLE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chenglong Li, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 801 days.

(21) Appl. No.: 16/966,054

(22) PCT Filed: Mar. 17, 2020

(86) PCT No.: PCT/CN2020/079593
§ 371 (c)(1),
(2) Date: Jul. 30, 2020

(87) PCT Pub. No.: WO2021/098095
PCT Pub. Date: May 27, 2021

(65) Prior Publication Data
US 2023/0091649 A1    Mar. 23, 2023

(30) Foreign Application Priority Data

Nov. 21, 2019    (CN) .......................... 201911146525.5

(51) Int. Cl.
*H05K 5/02*    (2006.01)
*H10K 77/10*    (2023.01)
(Continued)

(52) U.S. Cl.
CPC .............. *H10K 77/111* (2023.02); *B32B 3/18* (2013.01); *B32B 3/30* (2013.01); *B32B 7/12* (2013.01);
(Continued)

(58) Field of Classification Search
CPC ....... H05K 5/02; H05K 5/0017; H05K 5/0217
(Continued)

(56) References Cited

U.S. PATENT DOCUMENTS

2001/0009299 A1    7/2001    Saito et al.
2008/0273139 A1    11/2008    Sugawara et al.
(Continued)

FOREIGN PATENT DOCUMENTS

CN    101299105 A    11/2008
CN    104347678 A    2/2015
(Continued)

*Primary Examiner* — Hung S. Bui
(74) *Attorney, Agent, or Firm* — PV IP PC; Wei Te Chung; Zhigang Ma

(57) ABSTRACT

A flexible display device is provided, including a flexible display panel which includes a display area, a bending area and a bonding area, wherein the bending area is located between the display area and the bonding area; a first backplate located on a non-display surface of the display area; and a second backplate located on a non-bonding surface of the bonding area; wherein at least one of the first backplate and the second backplate is defined as a backplate structure, the backplate structure comprises a supporting layer and a porous material layer, and the porous material layer is adhered to the flexible display panel at an end of the bending area.

15 Claims, 2 Drawing Sheets

(51) Int. Cl.

| | |
|---|---|
| *B32B 3/18* | (2006.01) |
| *B32B 3/30* | (2006.01) |
| *B32B 7/12* | (2006.01) |
| *B32B 15/09* | (2006.01) |
| *B32B 27/36* | (2006.01) |
| *H10K 102/00* | (2023.01) |
| *B32B 5/18* | (2006.01) |
| *B32B 15/04* | (2006.01) |
| *B32B 15/20* | (2006.01) |
| *B32B 17/10* | (2006.01) |
| *B32B 27/08* | (2006.01) |
| *B32B 27/28* | (2006.01) |

(52) U.S. Cl.
CPC ............ *B32B 15/09* (2013.01); *B32B 27/36* (2013.01); *H05K 5/02* (2013.01); *B32B 5/18* (2013.01); *B32B 15/046* (2013.01); *B32B 15/20* (2013.01); *B32B 17/10* (2013.01); *B32B 27/08* (2013.01); *B32B 27/281* (2013.01); *B32B 2307/732* (2013.01); *B32B 2457/206* (2013.01); *H10K 2102/311* (2023.02)

(58) Field of Classification Search
USPC .......................................................... 361/807
See application file for complete search history.

(56) References Cited

U.S. PATENT DOCUMENTS

| | | | |
|---|---|---|---|
| 2016/0070304 A1 | 3/2016 | Shin et al. | |
| 2016/0271914 A1 | 9/2016 | Xie | |
| 2019/0207130 A1 | 7/2019 | He et al. | |
| 2019/0230783 A1 | 7/2019 | Park et al. | |
| 2019/0237532 A1* | 8/2019 | Ahn | H05K 1/189 |
| 2020/0136085 A1 | 4/2020 | Wang et al. | |
| 2022/0312654 A1* | 9/2022 | Zhang | G06F 1/203 |

FOREIGN PATENT DOCUMENTS

| | | | | |
|---|---|---|---|---|
| CN | 106887186 A | | 6/2017 | |
| CN | 108073230 A | | 5/2018 | |
| CN | 108198842 4 | | 6/2018 | |
| CN | 207800055 U | | 8/2018 | |
| CN | 108877513 A | | 11/2018 | |
| CN | 108878483 A | | 11/2018 | |
| CN | 108986670 A | | 12/2018 | |
| CN | 109036159 A | | 12/2018 | |
| CN | 109377877 A | | 2/2019 | |
| CN | 208488918 U | | 2/2019 | |
| CN | 109616021 A | | 4/2019 | |
| CN | 109979327 A | | 7/2019 | |
| CN | 109994606 A | | 7/2019 | |
| CN | 110379308 | * | 10/2019 | G09F 9/30 |
| CN | 110728907 A | | 1/2020 | |
| CN | 115188908 | * | 10/2022 | H01L 51/52 |
| KR | 20160029543 A | | 3/2016 | |
| KR | 20190092657 A | | 8/2019 | |
| WO | 2019089104 A | | 5/2019 | |

* cited by examiner

FLEXIBLE DISPLAY DEVICE

BACKGROUND OF INVENTION

Field of Invention

The present application relates to a flexible display device, and particularly relates to a flexible display device which could reduce stress that a flexible substrate is subjected to when bended, preventing circuits from damages and cracks so as to improve yield.

Description of Prior Art

Along with development and maturity of flexible organic light-emitting diode (OLED) display technologies, bezel-free OLED display devices have become one of the important development trends. In manufacturing processes of a bezel-free OLED display device, pad bending technology becomes one of the key points that determine yield. Pad bending technology refers to technology in which an OLED pad area is bended and attached to a backside of the OLED to achieve a full screen display effect. During bending, the flexible substrate of a flexible OLED display directly contacts a backplate (BP). The flexible substrate is subjected to stress when bended and circuits disposed on the flexible substrate are damaged and cracked, thus reducing yield.

In view of this, the present application provides a flexible display device which could reduce stress that a flexible substrate is subjected to when bended, preventing circuits from damages and cracks so as to improve yield.

SUMMARY OF INVENTION

A flexible display device comprises a flexible display panel, wherein the flexible display panel comprises a display area, a bending area and a bonding area, and wherein the bending area is located between the display area and the bonding area; a first backplate, wherein the first backplate is located on a non-display surface of the display area; a second backplate, wherein the second backplate is located on a non-bonding surface of the bonding area; wherein at least one of the first backplate and the second backplate is defined as a backplate structure, the backplate structure comprises a supporting layer and a porous material layer, and the porous material layer is adhered to the flexible display panel at an end of the bending area.

In one embodiment of the present application, the supporting layer and the porous material layer are disposed in a stack, and the porous material layer is disposed between the supporting layer and the flexible display panel.

In one embodiment of the present application, a thickness of the supporting layer accounts for 60% to 80% of a thickness of the backplate structure and a thickness of the porous material layer accounts for 20% to 40% of the thickness of the backplate structure.

In one embodiment of the present application, a thickness of the supporting layer ranges from 60 m to 80 m and a thickness of the porous material layer ranges from 20 m to 40 m.

In one embodiment of the present application, the supporting layer and the porous material layer are disposed in a stack, and both the supporting layer and the porous material layer are adhered to the flexible display panel.

In one embodiment of the present application, the supporting layer and the porous material layer are horizontally arranged on the flexible display panel, and both the supporting layer and the porous material layer are adhered to the flexible display panel.

In one embodiment of the present application, a groove is provided in the supporting layer, the groove is located on a side of the supporting layer near the bending area, and the porous material layer is located inside the groove.

In one embodiment of the present application, the backplate structure comprises at least one curved surface, and the at least one curved surface contacts the end of the bending area.

In one embodiment of the present application, the at least one curved surface comprises a curved surface located at the porous material layer or a curved surface jointly formed by the porous material layer and the supporting layer.

In one embodiment of the present application, the at least one curved surface comprises a curved surface of the porous material layer and a curved surface located at the supporting layer.

In one embodiment of the present application, a hardness of the supporting layer is greater than a hardness of the porous material layer.

In one embodiment of the present application, a material of the supporting layer is selected from one or more of a polyterephthalic acid plastic and a polyethylene material.

In one embodiment of the present application, a driver chip and a flexible circuit board are disposed on a bonding surface of the bonding area and a metal layer and a pad are disposed on a side of the first backplate away from the flexible display panel.

In one embodiment of the present application, a porous material comprises one or more of a metal fiber, a porous gel, a porous rubber, a sponge or a foam plastic.

In one embodiment of the present application, a UV glue is further disposed on a surface of the flexible display panel away from the first backplate and the second backplate.

In one embodiment of the present application, the flexible display device is an organic light-emitting diode display device.

In the backplate structure of one embodiment of the present application, a double-layer structure of the supporting layer and the porous material layer are adopted, and holes in the porous material are configured to reduce the stress between the backplate structure and the flexible display panel. At the same time, the curved surface is disposed at a position where the backplate structure contacts the flexible display panel, which replaces point contact or line contact with surface contact, further reducing stress and preventing circuits from damages and cracks, so as to improve yield.

BRIEF DESCRIPTION OF DRAWINGS

In order to more clearly illustrate the technical solution of the present application, a brief description of the drawings that are necessary for the illustration of the embodiments will be given as follows. Obviously, the drawings described below show only some embodiments of the present invention, and a person having ordinary skill in the art may also obtain other drawings based on the drawings described without making any creative effort.

DETAILED DESCRIPTION OF PREFERRED EMBODIMENTS

The present application is further described in detail below with reference to the accompanying drawings and embodiments. Obviously, the following described embodiments are only part of the present application but not all. A person having ordinary skill in the art may obtain other embodiments based on the embodiments provided in the present application without making any creative effort, which all belong to the scope of the present application.

Figure 1:
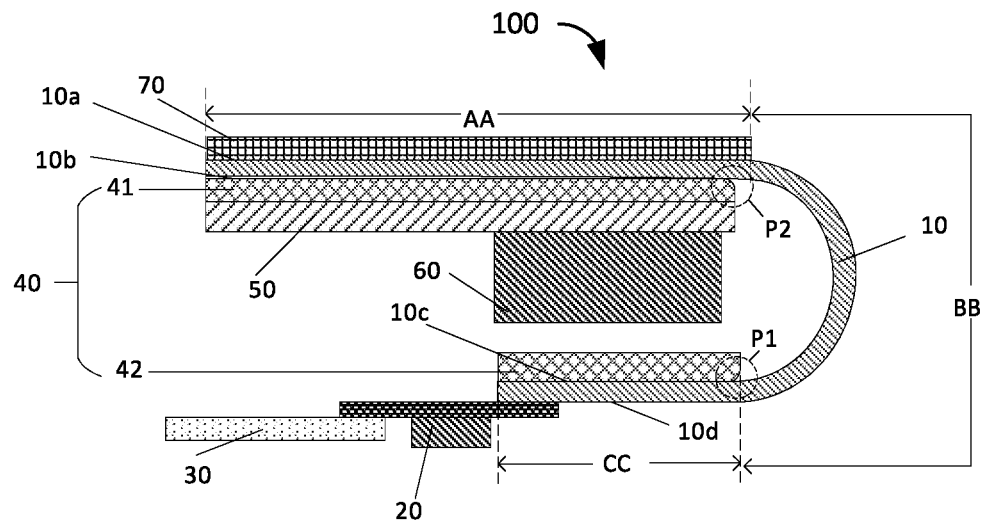
FIG. 1 is a cross-sectional view of a flexible display device of one embodiment of the present application.

Please refer to FIG. 1, a flexible display device 100 is provided by one embodiment of the present application. The flexible display device is an organic light emitting diode (OLED) display device.

The flexible display device 100 includes a bendable flexible display panel 10. Polymer materials such as polyimide plastic, poly-ether-ether-ketone or transparent conductive polyester can be used as a material of a substrate of the flexible display panel 10. In this embodiment, polyimide (PI) is adopted. The flexible display panel 10 can be divided into a display area AA, a bending area BB, and a bonding area CC.

The display area AA is configured to display images. A surface of the display area AA configured to display images is known as a display surface 10a. An opposite surface of the display surface 10a is known as a non-display surface 10b. The bending area BB has a shape of an arc and is located between the display area AA and the bonding area CC. A surface of the bonding area CC facing away from the display area AA is known as a bonding surface 10c, and a surface of the bonding area CC facing the display area AA is known as a non-bonding surface 10d. The bonding surface 10c is configured to connect a driver chip (integrated circuit, IC) 20 and a flexible printed circuit (FPC) 30 so as to transmit driving signals to the flexible display panel 10. In one embodiment of the present application, the driver chip (integrated circuit, IC) 20 is mounted on a thin film. That is to say, a chip on film (COF) is adopted.

The flexible display panel 10 further comprises a first backplate 41 and a second backplate 42 configured to support and protect the flexible display panel 10. The first backplate 41 is disposed on the non-display surface 10b of the display area AA. The second backplate 42 is disposed on the non-bonding surface 10d of the bonding area CC.

Figure 2A:
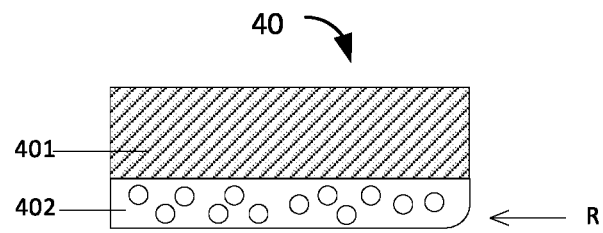
FIG. 2(a) to FIG. 2(e) are cross-sectional views of backplate structures of flexible display devices according to embodiments of the present application.
Figure 2B:
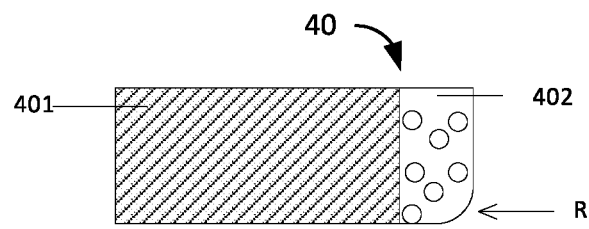
Figure 2C:
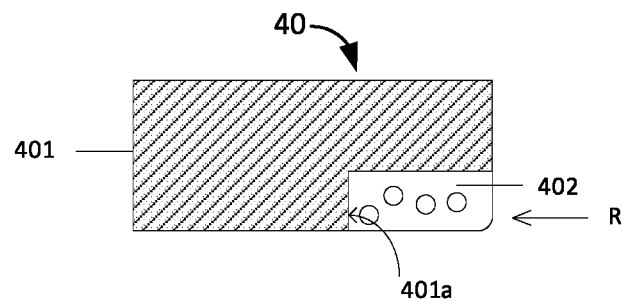

At least one of the first backplate 41 and the second backplate 42 is defined as a backplate structure 40. Please refer to FIG. 2(a) to FIG. 2(c), the backplate structure 40 includes a supporting layer 401 and a porous material layer 402. The porous material layer 402 of the backplate structure 40 is adhered to the flexible display panel 10 at an end P1 and an end P2 of the bending area BB. Specifically, as shown in FIG. 2(a), the supporting layer 401 and the porous material layer 402 are disposed in a stack vertically. The porous material layer 402 is disposed between the supporting layer 401 and the flexible display panel 10. In the present embodiment, a thickness of the supporting layer 401 accounts for 60% to 80% of a thickness of the backplate structure 40, which is approximately 60 m to 80 m, and a thickness of the porous material layer 402 accounts for 20% to 40% of the thickness of the backplate structure, which is approximately 20 m to 40 m. As shown in FIG. 2(b), in another embodiment of the present application, the supporting layer 401 and the porous material layer 402 are disposed in a stack horizontally. Both the supporting layer 401 and the porous material layer 402 are adhered to the flexible display panel 10. As shown in FIG. 2(c), in another embodiment of the present application, a groove 401a is provided in the supporting layer 401, the groove 401a is located on a side of the supporting layer 401 near the bending area BB, and the porous material layer 402 is located inside the groove 401a. The porous material layer 402 is only disposed at a corner of the backplate structure 40. Both the supporting layer 401 and the porous material layer 402 are adhered to the flexible display panel 10.

The supporting layer 401 is configured to support the flexible display panel 10, therefore materials with greater hardness could be adopted. A material of the supporting layer includes but not limited to one or more of polyethylene terephthalate (PET) plastics and polyethylene (PE) materials. In one embodiment of the present application, to prevent an increase in the thickness of the backplate structure 40 while preserving supporting force of the backplate structure 40, a hardness of the material of the supporting layer 401 is configured to be greater than a material of a supporting layer in the prior art.

The porous material layer 402 is configured to relieve stress between the backplate structure 40 and the flexible substrate of the flexible display panel 10, and can protect circuits formed on the flexible display panel 10. Materials with lesser hardness can be adopted as a material of the porous material layer 401. Porous materials include but are not limited to one or more of a metal fiber, a porous gel, a porous rubber, a sponge, or a foam plastic.

Figure 2D:
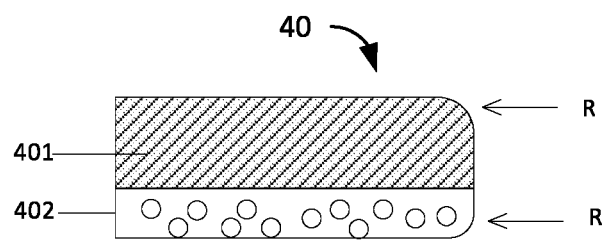
Figure 2E:
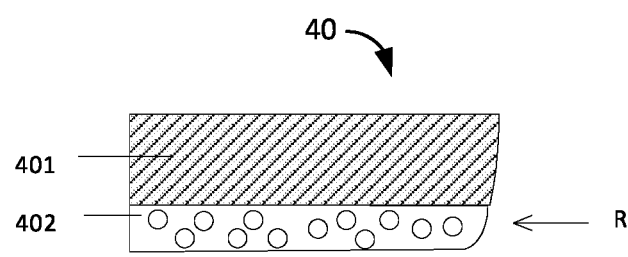

The backplate structure 40 includes at least one curved surface R. The at least one curved surface R contacts the end P1 and the end P2 of the bending area CC. For example, the curved surface R can be configured as a fillet. In this embodiment, as shown in FIG. 2(a), the at least one curved surface R is defined as a curved surface R located at the porous material layer 402. In other embodiments of the present embodiment, as shown in FIG. 2(d), the at least one curved surface R includes a curved surface R located at the porous material layer 402 and a curved surface R located at the supporting layer 401. As shown in FIG. 2(e), the at least one curved surface R includes a curved surface R jointly formed by the porous material layer 402 and the supporting layer 401.

The at least one curved surface R directly contacts the flexible substrate of the flexible display panel 10 so as to replace point contact or line contact between the backplate structure 40 and the flexible display panel with surface contact and effectively reduce the stress between the backplate structure 40 and the flexible substrate of the flexible display panel 10. Besides, although not shown in the drawings, a UV glue configured to enhance mechanical strength of the flexible display panel 10 is disposed on a surface of the flexible display panel 10 far away from the backplate. As coating of the UV glue is usually performed from one to another one of the end P1 and the end P2, flow characteristics of the UV glue lead to a result that a thickness of the UV glue at an area where the coating starts is greater and a thickness of the UV glue at an area where the coating completes is less. That is to say, one of the end P1 and the end P2 is exactly an area with the greatest thickness of the UV glue, namely, a position suffering the greatest stress. By configuring a surface contact between the end P1 and the end P2, the stress in a contacting area can be effectively reduced.

A metal layer 50 and a pad 60 are sequentially stacked on a side of the first backplate 41 away from the flexible display panel 10. The metal layer 50 can transmit heat generated by the flexible display panel 10 towards outside. And the metal layer 50 can also be configured to conduct static electricity on the organic light-emitting display device to prevent influence of static electricity on display effect. The metal layer 50 can be defined as a copper foil with great conductivity and thermal conductivity. The pad 60 is configured to prevent physical fractures of the display panel or internal signal circuit damages due to narrow bending angles during bending, and can reduce impact to the flexible display panel 10. The pad 60 could include polymers, such as polypropylene (PP) or polyethylene (PE), and it can also include materials with high elasticity, such as rubbers. In one embodiment of the present application, the pad 60 can be formed as a foam or a gel.

A cover plate 70 can also be disposed on a display surface 10*a* of the flexible display panel 10. The cover plate 70 is configured to protect elements such as the flexible display panel 10, and the cover plate 70 can be made of glass or plastic.

In the backplate structure of one embodiment of the present application, a double-layer structure of the supporting layer and the porous material layer are adopted, and holes in the porous material are configured to reduce the stress between the backplate structure and the flexible display panel. At the same time, the curved surface is disposed at a position where the backplate structure contacts the flexible display panel, which replaces point contact or line contact with surface contact, further reducing stress and preventing circuits from damages and cracks, so as to improve yield.

In other embodiments of the present application, one of the first backplate and the second backplate could be the double-layer structure of the supporting layer and the porous material layer, and other one is a backplate structure in prior art.

The above description provides a detailed introduction to the application. In this disclosure, specific examples are applied to explain principle and embodiments of the application. The description of the above embodiments is only used to help understand the application. At the same time, for those skilled in the art, according to the thought of the present application, there will be changes in the specific embodiments and application scope. In conclusion, the content of the specification should not be understood as the limitation of the application.

What is claimed is:

1. A flexible display device, comprising: a flexible display panel, wherein the flexible display panel comprises a display area, a bending area, and a bonding area, wherein the bending area is located between the display area and the bonding area; a first backplate, wherein the first backplate is located on a non-display surface of the display area; a second backplate, wherein the second backplate is located on a non-bonding surface of the bonding area; wherein at least one of the first backplate and the second backplate is defined as a backplate structure, the backplate structure comprises a supporting layer and a porous material layer, and the porous material layer is adhered to the flexible display panel at an end of the bending area,
    wherein a driver chip and a flexible circuit board are disposed on a bonding surface of the bonding area, and a metal layer and a pad are disposed on a side of the first backplate away from the flexible display panel.

2. The flexible display device of claim 1, wherein the supporting layer and the porous material layer are disposed in a stack, and the porous material layer is disposed between the supporting layer and the flexible display panel.

3. The flexible display device of claim 2, wherein a thickness of the supporting layer accounts for 60% to 80% of a thickness of the backplate structure, and a thickness of the porous material layer accounts for 20% to 40% of the thickness of the backplate structure.

4. The flexible display device of claim 2, wherein a thickness of the supporting layer ranges from 60 μm to 80 μm, and a thickness of the porous material layer ranges from 20 μm to 40 μm.

5. The flexible display device of claim 1, wherein the supporting layer and the porous material layer are disposed in a stack, and both the supporting layer and the porous material layer are adhered to the flexible display panel.

6. The flexible display device of claim 1, wherein the supporting layer and the porous material layer are horizontally arranged on the flexible display panel, and both the supporting layer and the porous material layer are adhered to the flexible display panel.

7. The flexible display device of claim 1, wherein a groove is provided in the supporting layer, the groove is located on a side of the supporting layer near the bending area, and the porous material layer is located inside the groove.

8. The flexible display device of claim 1, wherein the backplate structure comprises at least one curved surface, and the at least one curved surface contacts the end of the bending area.

9. The flexible display device of claim 8, wherein the at least one curved surface comprises a curved surface located at the porous material layer or a curved surface jointly formed by the porous material layer and the supporting layer.

10. The flexible display device of claim 8, wherein the at least one curved surface comprises a curved surface of the porous material layer and a curved surface located at the supporting layer.

11. The flexible display device of claim 1, wherein a hardness of the supporting layer is greater than a hardness of the porous material layer.

12. The flexible display device of claim 11, wherein a material of the supporting layer is selected from one or more of a polyterephthalic acid plastic and a polyethylene material.

13. The flexible display device of claim 1, wherein a porous material comprises one or more of a metal fiber, a porous gel, a porous rubber, a sponge, or a foam plastic.

14. The flexible display device of claim 1, wherein a UV glue is further disposed on a surface of the flexible display panel away from the first backplate and the second backplate.

15. The flexible display device of claim 1, wherein the flexible display device is an organic light-emitting diode display device.

* * * * *